United States Patent
Bi

(10) Patent No.: US 12,016,146 B2
(45) Date of Patent: Jun. 18, 2024

(54) CABLE CONNECTION STRUCTURE, SINGLE-BOARD ASSEMBLY, SINGLE-BOARD ASSEMBLY CONNECTION STRUCTURE

(71) Applicant: ZTE CORPORATION, Guangdong (CN)

(72) Inventor: Yu Bi, Guangdong (CN)

(73) Assignee: XI'AN ZHONGXING NEW SOFTWARE CO., LTD., Shaanxi (CN)

( * ) Notice: Subject to any disclaimer, the term of this patent is extended or adjusted under 35 U.S.C. 154(b) by 0 days.

(21) Appl. No.: 17/773,689

(22) PCT Filed: Aug. 19, 2021

(86) PCT No.: PCT/CN2021/113543
§ 371 (c)(1),
(2) Date: May 2, 2022

(87) PCT Pub. No.: WO2022/042420
PCT Pub. Date: Mar. 3, 2022

(65) Prior Publication Data
US 2022/0386494 A1 Dec. 1, 2022

(30) Foreign Application Priority Data

Aug. 31, 2020 (CN) .......................... 202010897474.6

(51) Int. Cl.
*H05K 7/14* (2006.01)
*H01R 12/75* (2011.01)
*H01R 25/00* (2006.01)

(52) U.S. Cl.
CPC .......... *H05K 7/1422* (2013.01); *H01R 12/75* (2013.01); *H01R 25/006* (2013.01);
(Continued)

(58) Field of Classification Search
CPC .. H05K 7/1422; H05K 7/1417; H05K 7/1445; H05K 7/1447; H05K 7/1452; H01R 12/75; H01R 25/006
(Continued)

(56) References Cited

U.S. PATENT DOCUMENTS 5,211,565 A * 5/1993 Krajewski .............. H01R 12/79
361/735
8,702,318 B2 * 4/2014 Isenhour .................. G02B 6/32
385/71
(Continued)

FOREIGN PATENT DOCUMENTS

| CN | 103545630 A | 1/2014 |
|---|---|---|
| CN | 104254199 A | 12/2014 |

(Continued)

OTHER PUBLICATIONS

WIPO, International Search Report dated Sep. 23, 2021.
European Patent Office, EP21860258.9 Extended European Search Report dated Oct. 9, 2023.

*Primary Examiner* — Zhengfu J Feng
(74) *Attorney, Agent, or Firm* — Li & Cai Intellectual Property (USA) Office

(57) ABSTRACT

Embodiments of the disclosure provide a cable connection structure, including: a bearing member, the bearing member being provided with at least one cable connector, and each cable connector having a first port connected to a cable and a second port electrically connected to the first port; and a sliding structure connected to the bearing member, the bearing member being configured to be connected to a single board through the sliding structure, the bearing member enabling the single board connected to the bearing member to slide in a first direction which is a direction close to or away from the second port. Embodiments of the disclosure (Continued)

also provide a single-board assembly and a single-board assembly connection structure.

12 Claims, 5 Drawing Sheets

(52) U.S. Cl.
CPC ......... *H05K 7/1417* (2013.01); *H05K 7/1445* (2013.01); *H05K 7/1447* (2013.01); *H05K 7/1452* (2013.01)

(58) Field of Classification Search
USPC .......................................................... 361/759
See application file for complete search history.

(56) References Cited

U.S. PATENT DOCUMENTS

| | | | |
|---|---|---|---|
| 9,510,483 B1* | 11/2016 | West | H05K 7/20572 |
| 9,591,781 B2 | 3/2017 | Vanderveen | |
| 10,879,636 B2 | 12/2020 | Li | |
| 2004/0031767 A1* | 2/2004 | Ice | H05K 7/1404 |
| | | | 211/41.17 |
| 2006/0002659 A1* | 1/2006 | Kiani | G02B 6/3897 |
| | | | 385/53 |
| 2008/0314979 A1* | 12/2008 | Johnsen | H04Q 1/035 |
| | | | 235/385 |
| 2010/0014248 A1* | 1/2010 | Boyden | H05K 7/20563 |
| | | | 361/695 |
| 2013/0342996 A1 | 12/2013 | Fricker | |
| 2014/0220795 A1* | 8/2014 | Bai | H01R 12/737 |
| | | | 439/61 |
| 2019/0252811 A1 | 8/2019 | Li | |
| 2020/0321718 A1* | 10/2020 | Li | H05K 1/00 |

FOREIGN PATENT DOCUMENTS

| | | |
|---|---|---|
| CN | 106654728 A | 5/2017 |
| CN | 110635274 A | 12/2019 |
| WO | WO 2011044219 A2 | 4/2011 |

* cited by examiner

CABLE CONNECTION STRUCTURE, SINGLE-BOARD ASSEMBLY, SINGLE-BOARD ASSEMBLY CONNECTION STRUCTURE

CROSS-REFERENCE OF RELATED APPLICATIONS

This application claims priority to a Chinese patent application No. 202010897474.6, entitled "Cable Connection Structure, Single-board assembly, Single-board assembly Connection Structure", filed with the China National Intellectual Property Administration on Aug. 31, 2020, the entire contents of which are incorporated herein by reference.

TECHNICAL FIELD

Embodiments of the disclosure relate to, but are not limited to, the field of communications technologies, and in particular to a cable connection structure, a single-board assembly, and a single-board assembly connection structure.

BACKGROUND

With the rapid increase in demands for high bandwidth transmission and high performance computing, the requirements for signal rate and bandwidth between single boards (e.g., service single-boards, and wiring plates) are increasing in high-speed system architectures.

The single boards using PCB (Printed Circuit Board) technologies have high loss and inferior flexibility.

In orthogonal high-speed system architecture, the tolerance and deformation of the single board will inevitably accumulate at a connection structure (such as a connector) between the single boards, such that the connector works in a de-mate state, causing degradation of connector performance and affecting signal transmission.

SUMMARY

Embodiments of the disclosure provide a cable connection structure, a single-board assembly and a single-board assembly connection structure.

In the first aspect, according to an embodiment of the disclosure, there is provided a cable connection structure, including: a bearing member, the bearing member being provided with at least one cable connector, and each cable connector having a first port connected to a cable and a second port electrically connected to the first port; and a sliding structure connected to the bearing member, the bearing member being configured to be connected to a single board through the sliding structure, the bearing member enabling the single board connected to the bearing member to slide in a first direction which is a direction close to or away from the second port.

In some embodiments, the bearing member is formed as a plate shape and is provided with a plurality of cable connectors, and the plurality of cable connectors are arranged sequentially in a direction perpendicular to the first direction.

In some embodiments, the cable connection structure further incudes a sliding lock, the sliding lock being configured to fix the sliding structure relative to the bearing member.

In the second aspect, according to an embodiment of the disclosure, there is provided a single-board assembly, including a single board and any one of cable connection structures as set forth above, wherein the single board is slidably connected to the bearing member through the sliding structure; the single board includes at least one cable interface; and the single-board assembly further includes the cable connected between the cable interface and the first port of the cable connector.

In the third aspect, according to an embodiment of the disclosure, there is provided a single-board assembly connection structure, including: a first single-board assembly group, the first single-board assembly group including at least one of the single-board assemblies as set forth above; and a second single-board assembly group, the second single-board assembly group including at least one of the single-board assemblies as set forth above, wherein the second port of at least one cable connector of each single-board assembly in the first single-board assembly group is electrically connected to the second port of the cable connector of one single-board assembly in the second single-board assembly group.

In some embodiments, the second port of the at least one cable connector of each single-board assembly in the first single-board assembly group is connected to the second port of the cable connector of the one single-board assembly in the second single-board assembly group.

In some embodiments, the single-board assembly connection structure further includes a retaining frame, the first single-board assembly group and the second single-board assembly group being arranged on opposite sides of the retaining frame.

In some embodiments, the single-board assembly connection structure further includes a connection lock, the connection lock being configured to lock the cable connector of the first single-board assembly group relative to the cable connector of the second single-board assembly electrically connected to the cable connector of the first single-board assembly group.

In some embodiments, the cable connection structure of the single-board assembly connection structure further includes a sliding lock; and the single-board assembly connection structure further includes a linkage structure, the linkage structure being configured to place the connection lock in a locked state and place the sliding lock in an unlocked state; or to place the connection lock in an unlocked state and place the sliding lock in a locked state.

In some embodiments, the first single-board assembly group includes a plurality of single-board assemblies, wherein the single boards in the single-board assemblies are parallel to each other; and the second single-board assembly group includes a plurality of single-board assemblies, wherein the single boards of the single-board assemblies are parallel to each other and have an included angle greater than 0 degrees and less than or equal to 90 degrees relative to the single boards in the first single-board assembly group.

In some embodiments, the single-board assembly connection structure further includes a back plate, wherein the bearing member is coupled to the back plate; and the back plate has a third port, the third port being connected to the second port, and the third port connected to the second port in the first single-board assembly group being connected through a connecting circuit to another third port which is connected to the second port in the second single-board assembly group.

The embodiments of the disclosure provide a cable connection structure, a single-board assembly and a single-board assembly connection structure. The position of the cable connector is allowed to change in a certain direction relative to the single board by fixing the cable connector to the bearer member that is slidable relatively to the single board. When the deformation or tolerance of the single board can not ensure the cable connector to be in a desired position, that is, can not ensure the cable connector to work in the full-mate state, the sliding structure can change the position of the cable connector relative to the single board, so that the cable connector is still positioned in the full-mate state to ensure that the cable connector can work in the full-mate state. This approach avoids the degradation of the connector performance that may affect the transmission of signals, when the deformation or tolerance of the single board accumulates at the connector to make the connector work in the de-mate state.

BRIEF DESCRIPTION OF DRAWINGS

In the accompanying drawings of embodiments of the present disclosure.

DETAIL DESCRIPTION OF EMBODIMENTS

Figure 1:
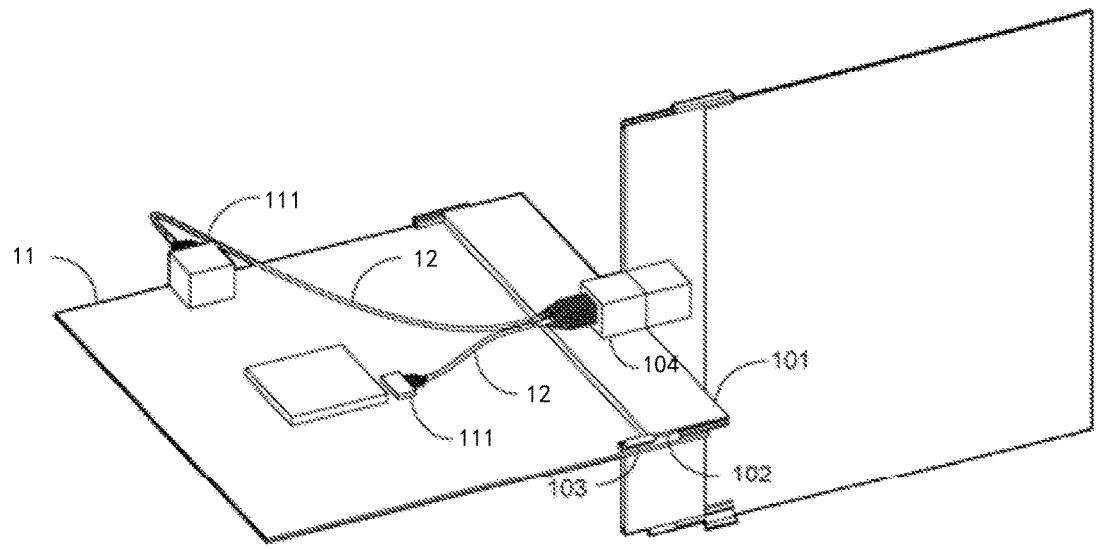
FIG. 1 is a schematic diagram of a cable connection structure and a single-board assembly according to an embodiment of the disclosure.

To enable those skilled in the art to better understand the technical schemes of the embodiments of the disclosure, the cable connection structure, the single-board assembly, and the single-board assembly connection structure according to the embodiments of the disclosure will be described in detail below in conjunction with the accompanying drawings.

The embodiments of the disclosure will be described completely below with reference to the accompanying drawings, but the embodiments as illustrated can be embodied in different forms and should not be construed as being limited to the embodiments set forth in the disclosure. Instead, these embodiments are provided for the purpose of making the present disclosure thorough and complete, so that those skilled in the art fully understand the scope of the present disclosure.

The accompanying drawings of the embodiments of the disclosure are intended to provide a further understanding of the embodiments of the disclosure and constitute a part of the specification, which together with the embodiments of the present disclosure, are used to explain the disclosure and do not constitute a limitation of the disclosure. The above and further features and advantages will become more apparent to those skilled in the art through the description of the detailed exemplary embodiments with reference to the accompanying drawings.

The embodiments of the present disclosure can be described with reference to plans and/or cross-sectional views with the aid of ideal schematics of the disclosure. Thus, the exemplary illustrations can be modified according to manufacturing techniques and/or tolerances.

In the absence of conflict, the various embodiments and features of the embodiments of the disclosure can be combined with each other.

The terminologies used herein are intended to describe specific embodiments only and are not intended to limit the present disclosure. The term "and/or" as used herein includes any and all combinations of one or more related enumerated entries. The singular forms "a", "an" and "the" as used herein are also intended to include the plural forms, unless the context clearly indicates otherwise. The terms "comprising", "made from . . . " as used herein designate the presence of the described features, wholes, steps, operations, elements and/or components, but do not preclude the presence or addition of one or more other features, wholes, steps, operations, elements, components and/or groups thereof.

Unless otherwise indicated, all terms used in the disclosure, including technical and scientific terms, will have the same meaning as commonly understood by those having ordinary skill in the art. It will also be understood that terms such as those defined in commonly used dictionaries should be construed to have a meaning consistent with their meaning in the related art and in the context of the disclosure, and will not be construed to have an idealized or overly formal meaning unless the disclosure is expressly so defined.

The embodiments of the disclosure are not limited to the embodiments shown in the accompanying drawings, but include modifications of the configuration based on the manufacturing process. Accordingly, an exemplified zone in the accompanying drawings has schematic attribution and a shape of the zone exemplifies a specific shape of the zone of a component but is not intended to be limiting.

High-speed system architectures use PCBs as the medium for signal transmission. As the signal transmission rate increases and the signal transmission bandwidth increases, the insertion loss of the signal transmission also increases. In order to reduce the insertion loss, in some related technologies, cables are used instead of PCBs as a medium for signal transmission.

On one hand, compared to the PCB, the cable has a lower insertion loss by a unit length; on the other hand, considering that the PCB is used as a medium for signal transmission and the signal transmission needs to rely on the PCB wiring, the cable has greater flexibility compared to the PCB wiring using crimp for the transmission signal.

The use of cable effectively reduces the insertion loss in the signal transmission process. However, in the actual high-speed system architecture, especially in the orthogonal high-speed system architecture, the accumulation of tolerances and structural deformations (such as single board deformation) may result in that a connecting device (such as a connector) between the single boards can not work in a full-mate state, that is, works in a de-mate state. This can not be resolved by using a cable instead of PCB as a medium for signal transmission.

When the connector works in the de-mate state, compared to its work in the full-mate state, the impedance characteristics and insertion loss will be significantly degraded.

Especially when the signal transmission bandwidth reaches a certain threshold, the insertion loss (and the insertion loss fluctuation) of the connector will be obviously deteriorated. A desired rate of high-speed serial single-channel signal (SerDes rate) for the service is 112 Gbps or higher. At this point, an operation frequency point of the connector is 28 GHz (fluctuating in the range of 0 to 42 GHz), reaching a threshold of significant deterioration in connector performance. Therefore, it is not negligible that the the performance degradation brought by the connector working in the de-mate state affects the signal transmission.

The connector working in the de-mate state will cause the degradation of the connector performance, while in order to ensure the mechanical contact of the connector when the connector works in the de-mate state, a terminal of the connector is necessarily designed to provide a longer friction distance. In order to ensure the performance and robustness of the connector in the case of the longer friction distance, the design complexity and design cost of the connector are further greatly increased.

In some related arts, the upgraded connector with higher design complexity is used to ensure that the connector provides an excellent performance even when works in the de-mate state. However the connector with higher design complexity has a long iteration cycle, which especially may be a great challenge especially when compatible with existing products.

In some related arts, the connector performance is ensured by limiting the deformation and tolerance of the single board in the high-speed system architectures to ensure that the connector works in the full-mate state as much as possible. However even if the current structural design has employed advanced panel wrench and screw locking design to make the tolerance accumulation in the single board rather than single board connection (such as connector) as far as possible, due to the larger sizes of the frame and single board, structural deformation and other factors, the connector may still work in the de-mate state. In other words, there may be a certain de-mate distance. Even though the de-mate distance is 1.0 mm, the connector performance may also undergo a significant degradation.

In a first aspect, referring to FIGS. 1 to 8, an embodiment of the disclosure provides a cable connection structure, including:

a bearing member 101 provided with at least one cable connector 104, each cable connector 104 having a first port connected to a cable 12 and a second port electrically connected to the first port; and a sliding structure 102 connected to the bearing member 101, the bearing member 101 being configured to be connected to a single board 11 through the sliding structure 102, the bearing member 101 enabling the single board 11 connected to the bearing member to slide in a first direction which a direction close to or away from the second port of the cable connector 104 on the bearing member 101.

The cable connection structure according to the embodiment of the disclosure specifically includes the bearing member 101, the at least one cable connector 104 fixedly provided on the bearing member 101, and the sliding structure 102 connected to the bearing member 101.

The cable connector 104 is fixed to the bearing member 101. For example, the cable connector 104 can be fixed to the bearing member 101 by crimping (of course, except for a fixing role, crimp pins do not have a signal transmission function). Of course, the cable connector 104 can also be fixed to the bearing member 101 by other means (such as welding, bonding, or clamping).

The cable connector 104 has the first port and the second port, the first port is configured to connect to the cable 12, and the second port can be electrically connected to the first port while connected to the other ports. In other words, the signal can be transmitted through the cable 12 to the first port connected to the cable 12 and then to other ports connected to the second port in connection with the first port.

The sliding structure 102 connected to the bearing member 101 can specifically be a slide rail. The bearing member 101 can be connected to the single board 11 by the sliding structure 102, and the single board 11 connected to the bearing member 101 can slide in the first direction by means of the sliding structure 102. The first direction is a direction close to or away from the second port of the cable connector 104. The sliding is relative. If the single board 11 connected to the sliding structure 102 is fixed and cannot slide, the bearing member 101 can slide in the first direction relative to the single board 11.

The cable connection structure according to the embodiment of the disclosure allows the position of the cable connector 104 to change in a certain direction relative to the single board 11 by fixing the cable connector 104 to the bearer member 101 that is slidable relatively to the single board 11. When the deformation or tolerance of the single board 11 can not ensure the cable connector 104 to be in a desired position, that is, can not ensure the cable connector 104 to work in the full-mate state, the sliding structure 102 can change the position of the cable connector 104 relative to the single board 11, so that the cable connector 104 is still positioned in the full-mate state to ensure that the cable connector 104 can work in the full-mate state. This approach avoids the degradation of the connector performance that may affect the transmission of signals when the deformation or tolerance of the single board 11 accumulates at the connector to make the connector work in the de-mate state.

In some embodiments, referring to FIGS. 1 to 8, the bearing member 101 is in the form of a plate with a plurality of cable connectors 104, and the plurality of cable connectors 104 are arranged sequentially along a direction perpendicular to the first direction.

The bearer member 101 of the cable connection structure according to the embodiment of the disclosure can be specifically in the form of a plate. Specifically, the bearing member can be a single board 11 having a size smaller than a general single board 11. A plurality of cable connectors 104 are fixed to the bearing member 101 and arranged along the direction perpendicular to the first direction, that is, the cable connectors 104 are arranged perpendicularly to the direction in which the single board 11 slides.

Since the bearing member 101 is connected to the single plate 11 through the sliding structure 102, a length of the bearing member 101 in the direction perpendicular to the first direction is fixed. The cable connectors 104 arranged in the direction perpendicular to the first direction can ensure that the length of the bearing member 101 in the direction perpendicular to the first direction is fully utilized (if the cable connectors 104 are arranged in a direction parallel to the first direction, for a length of the bearing member 101 in the direction perpendicular to the first direction, only a length of a single cable connector 104 is utilized), thereby reducing the size of the bearing member 101.

In some embodiments, the cable connection structure further includes a sliding lock 103 configured to fix the sliding structure 102 relative to the bearing member 101.

The cable connection structure according to the embodiment of the disclosure further includes a sliding lock 103 by which the sliding structure 102 can be fixed in place relative to the bearing member 101. Essentially, the sliding lock allows for a rigid structural relationship between the single board 11 connected to the sliding structure 102 and the bearing member 101 in a fixed relative position. In other words, when the sliding lock 103 is locked, the single board 11 connected to the sliding structure 102 is fixed and cannot slide, and the bearing member 101 is also fixed and cannot slide; when the sliding lock 103 is unlocked, the single board 11 connected to the sliding structure 102 can slide relative to the bearing member 101 (the single board 11 connected to the sliding structure 102 is slidable along the sliding structure 102 or the bearing member 101 is slidable along the sliding structure 102 or both the single board 11 and the bearing member 101 are slidable along the sliding structure 102).

When the connection between the single board 11 connected to the sliding structure 102 and the bearing member 101 has been built and a change in the relative position is not desired, the sliding lock 103 can be used to fix the relative position between the single board 11 connected to the sliding structure 102 and the bearing member 101, thereby facilitating their installation or movement as a whole.

Figure 2:
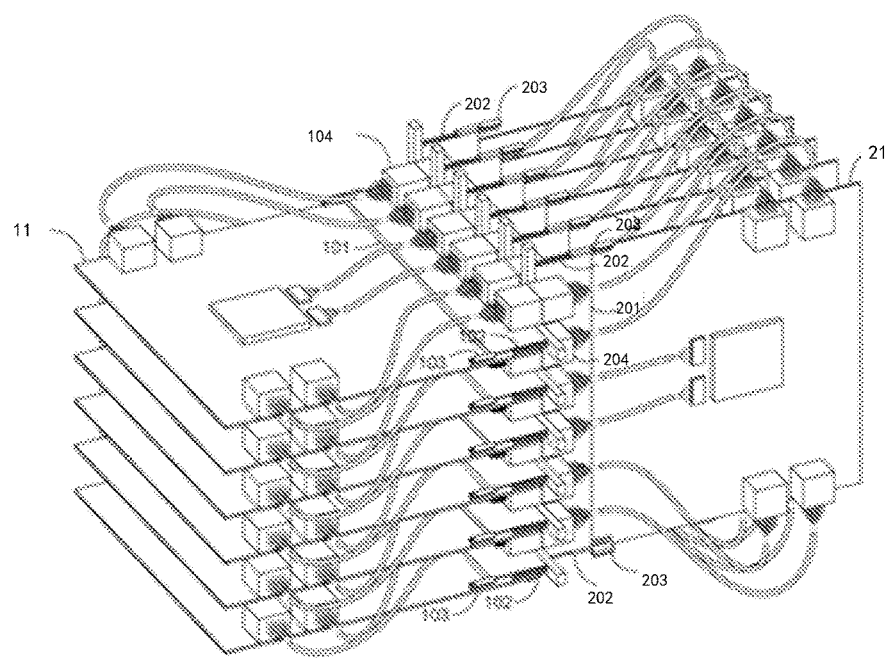
FIG. 2 is a schematic diagram of a single-board assembly connection structure according to an embodiment of the disclosure.

In a second aspect, referring to FIG. 2, an embodiment of the disclosure provides a single-board assembly 1, the single-board assembly comprising: a single board 11 and any one of the above cable connection structures, wherein the single board 11 is slidably connected to the bearing member 101 through the sliding structure 102.

The single board 11 includes at least one cable interface 111.

The single-board assembly 1 further includes a cable 12 connected between the cable interface 111 and a first port of a cable connector 104.

The single-board assembly 1 according to the embodiment of the disclosure specifically includes any one of the above cable connection structures, and the single board 11 slidably connected to the bearing member 101 of the cable connection structure by the sliding structure 102 of the cable connection structure. The single board 11 is provided with at least one cable interface 111 (which, in particular, may also be the cable connector). The cable interface 111 can be located anywhere on the single board 11 (e.g., on the board or on the edge of the board). The cable interface 111 on the single board 11 is connected to the first port of the cable connector 104 of the cable connection structure via the cable 12.

In particular, the single board 11 may be a service board, or a switching network board, for example. The cable interface 111 on the single board 11 and the cable connector 104 of the cable connection structure may have a one-to-one relationship, i.e., each cable interface 111 on the single board 11 is connected to a first port of a different cable connector 104 of the cable connection structure. The cable interface 111 on the single board 11 and the cable connector 104 of the cable connection structure may have a one-to-many relationship, i.e., each cable interface 111 on the single board 11 is connected to first ports of a plurality of different cable connectors 104 of the cable connection structure. The cable interface 111 on the single board 11 and the cable connector 104 of the cable connection structure may have a many-to-one relationship, i.e., a first port of each cable connector 104 of the cable connection structure is connected to a plurality of different cable interfaces 111 on the single board 11.

The cable 12 has flexibility compared to the PCB. The cable connector 104 is connected to the single board 11 via the cable 12. Even though the relative position of the cable connector 104 to the single board 11 changes, the signal transmission will not be affected due to their connection through the cable 12.

The single-board assembly 1 according to the embodiment of the disclosure allows, by means of the flexibility of the cable 12, the position of the cable connector 104 to change in a certain direction relative to the single board 11 by fixing the cable connector 104 to the bearer member 101 that is slidable relatively to the single board 11. When the deformation or tolerance of the single board 11 can not ensure the cable connector 104 to be in a desired position, that is, can not ensure the cable connector 104 to work in the full-mate state, the sliding structure 102 can change the position of the cable connector 104 relative to the single board 11, so that the cable connector 104 is still positioned in the full-mate state to ensure that the cable connector 104 can work in the full-mate state. This approach avoids the degradation of the connector performance that may affect the transmission of signals when the deformation or tolerance of the single board 11 accumulates at the connector to make the connector work in the de-mate state.

In a third aspect, referring to FIGS. 1 to 8, an embodiment of the disclosure provides a single-board assembly connection structure, the single-board assembly connection structure including:

a first single-board assembly group including at least one of the above-mentioned single board assemblies 1; and a second single-board assembly group including at least one of the above-mentioned single board assemblies 2, wherein a second port of at least one cable connector 104 of each of single board assemblies 1 in the first single-board assembly group is electrically connected to a second port of a cable connector 204 of one of single board assemblies 2 in the second single-board assembly group.

To distinguish the first single-board assembly group from the second single-board assembly group, the single board assemblies of the second single-board assembly group are referenced by a numeral "2" in FIGS. 1 to 8. Each single-board assembly 2 includes a bearing member 201, a sliding structure 202, and a cable connector 204 disposed on the bearing member 201; in some embodiments, the single-board assembly 2 also includes a sliding locking structure 203. However, the single-board assembly 2 and the single-board assembly 1 can have essentially the same structure, which is the single-board assembly according to the embodiment of the disclosure.

The single-board assembly connection structure according to the embodiment of the disclosure particularly includes the first single-board assembly group and the second single-board assembly group. Each of the single-board assembly groups includes the at least one single-board assembly 1 or 2. Each single-board assembly 1 of the first single-board assembly group has a second port of at least one cable connector 104 electrically connected to a second port of a cable connector 204 of one of the single board assemblies 2 of the second single-board assembly group.

The single-board assembly connection structure according to the embodiment of the disclosure allows the position of the cable connector 104 to change in a certain direction relative to the single board 11 by fixing the cable connector 104 to the bearer member 101 that is slidable relatively to the single board 11. When the deformation or tolerance of the single board 11 can not ensure the cable connector 104 to be in a desired position, that is, can not ensure the cable connector 104 to work in the full-mate state, the sliding structure 102 can change the position of the cable connector 104 relative to the single board 11, so that the cable connector 104 is still positioned in the full-mate state to ensure that the cable connector 104 can work in the full-mate state. This approach avoids the degradation of the connector performance that may affect the transmission of signals when the deformation or tolerance of the single board 11 accumulates at the connector to make the connector work in the de-mate state.

In some embodiments, referring to FIGS. 1 to 4, a second port of at least one cable connector 104 in each single-board assembly 1 of the first single-board assembly group is connected to a second port of cable connector 204 of a single-board assembly 2 of the second single-board assembly group.

In the single-board assembly connection structure according to this embodiment of the disclosure, each single-board assembly 1 of the first single-board assembly group has a second port of at least one cable connector 104 connected to a second port of the cable connector 204 of one of the single board assemblies 2 of the second single-board assembly group. Herein, the term "connected" refers to the connection of the cable connectors 104 or 204 of the different groups in the full-mate state.

In other words, the second port of at least one cable connector 104 of each single-board assembly 1 in the first single-board assembly group is directly connected to the second port of the cable connector 204 of one of the single board assemblies 2 in the second single-board assembly group, rather than being electrically connected via other ports or cables 12, for example.

Figure 3:
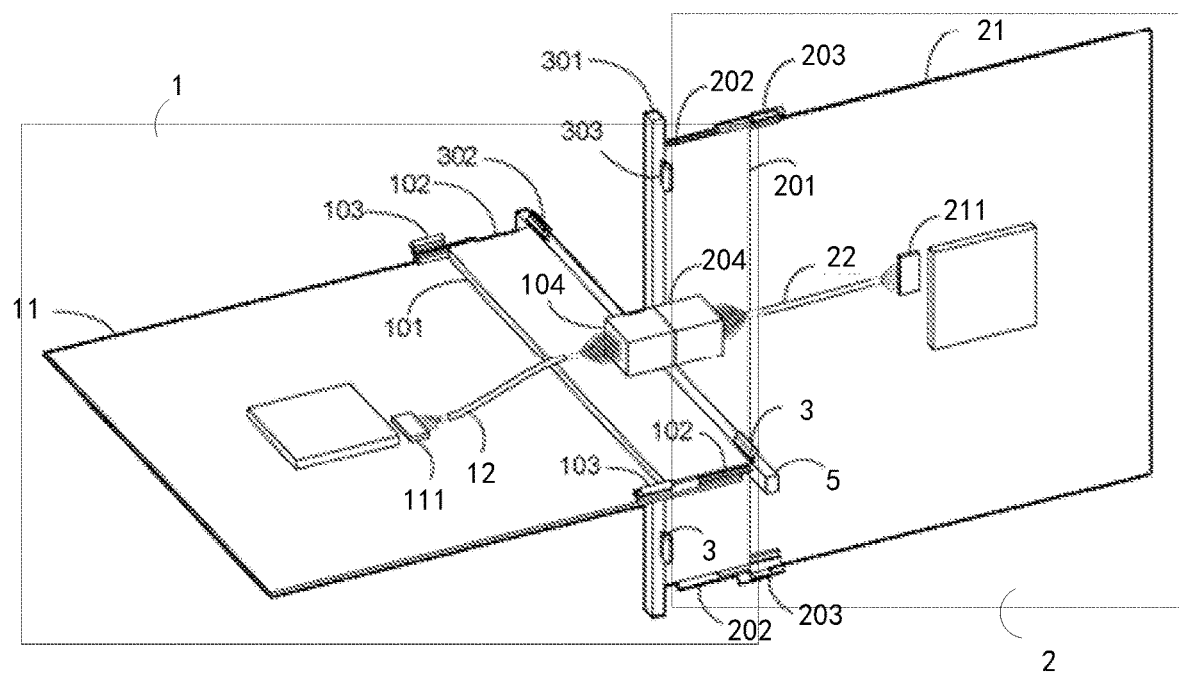
FIG. 3 is a schematic diagram of a single-board assembly including a first single-board assembly group and a second single-board assembly group in the single-board assembly connection structure according to the embodiment of the disclosure.

In some embodiments, referring to FIGS. 2 and 3, the first single-board assembly group includes any of the above single board assemblies 1, wherein the single boards 11 of each single-board assembly 1 are parallel to each other; and the second single-board assembly group includes any of the above single board assemblies 2, wherein the single boards 21 of each single-board assembly 2 are parallel to each other and have an included angle larger than 0 degrees and less than or equal to 90 degrees with respect to the single boards 11 in the first single-board assembly group.

In the single-board assembly connection structure according to the embodiment of the disclosure, the first single-board assembly group includes a plurality of single board assemblies 1, and the second single-board assembly group includes a plurality of single board assemblies 2.

Specifically, the single board 11 or 21 in the first single-board assembly group and the second single-board assembly group can be a service single board or a switching network board, for example, which is usually in the form of a plate. The single boards 11 of each single-board assembly 1 of the first single-board assembly group are parallel to each other, and the single boards 21 of each single-board assembly 2 of the second single-board assembly group are parallel to each other. The single boards (i.e., the single board 11 and single board 21) of the single board assemblies of different groups are arranged at a specific included angle (i.e., inclined relative to each other).

The single boards of the single board assemblies of different groups are inclined relative to each other, and the single boards of each single-board assembly can intersect with the single boards of the single board assemblies in another single-board assembly group for more connections. Further, an included angle between the single board 11 and the single board 21 is greater than 60 degrees and less than or equal to 90 degrees. Furthermore, as shown in FIG. 2, the included angle between the single board 21 and the single board 11 is equal to 90 degrees, such that the first single-board assembly group and the second single-board assembly group form an orthogonal high-speed system architecture.

With the first single-board assembly group and the second single-board assembly group according to the embodiment of the disclosure, it is possible to achieve the connection of the cable interface 111 on the single board 11 of the first single-board assembly group to the first port of the cable connector 104 of the cable connection structure in the single-board assembly 1 of the first single-board assembly group via the cable 12, the connection of the second port of the cable connector 104 in the first single-board assembly group to the second port of the cable connector 204 in the second single-board assembly group, and the connection of the first port of the cable connector 204 in the second single-board assembly group to the cable interface 211 on the single board 21 of the second single-board assembly group via the cable 22. In this way, the transmission of signals from the single board 11 of the first single-board assembly group to the single board 21 of the second single-board assembly group can be achieved. Of course, the signal can also be transmitted in reverse, i.e., from the single board 21 of the second single-board assembly group to the single board 11 of the first single-board assembly group.

In some embodiments, the single-board assembly connection structure further includes a connection lock 3 configured to lock the cable connector 104 of the first single-board assembly group to the cable connector 204 of the second single-board assembly 2 that is electrically connected to the cable connector 104.

The single-board assembly connection structure according to the embodiment of the disclosure further includes a connection lock 3 configured to lock the cable connector 104 of the first single-board assembly group to the cable connector 204 of the second single-board assembly group.

When the second port of the cable connector 104 of the first single-board assembly group is connected to the second port of the cable connector 204 of the second single-board assembly group, i.e., the cable connector 104 of the first single-board assembly group is fully mated with the cable connector 204 of the second single-board assembly group, the connection lock 3 is locked to secure the cable connector 104 of the first single-board assembly group to the cable connector 204 of the second single-board assembly group. In this way, the cable connector 104 of the first single-board assembly group and the cable connector 204 of the second single-board assembly group are always fully mated to ensure that the cable connector 104 of the first single-board assembly group and the cable connector 204 of the second single-board assembly group can work in the full-mate state.

Figure 4:
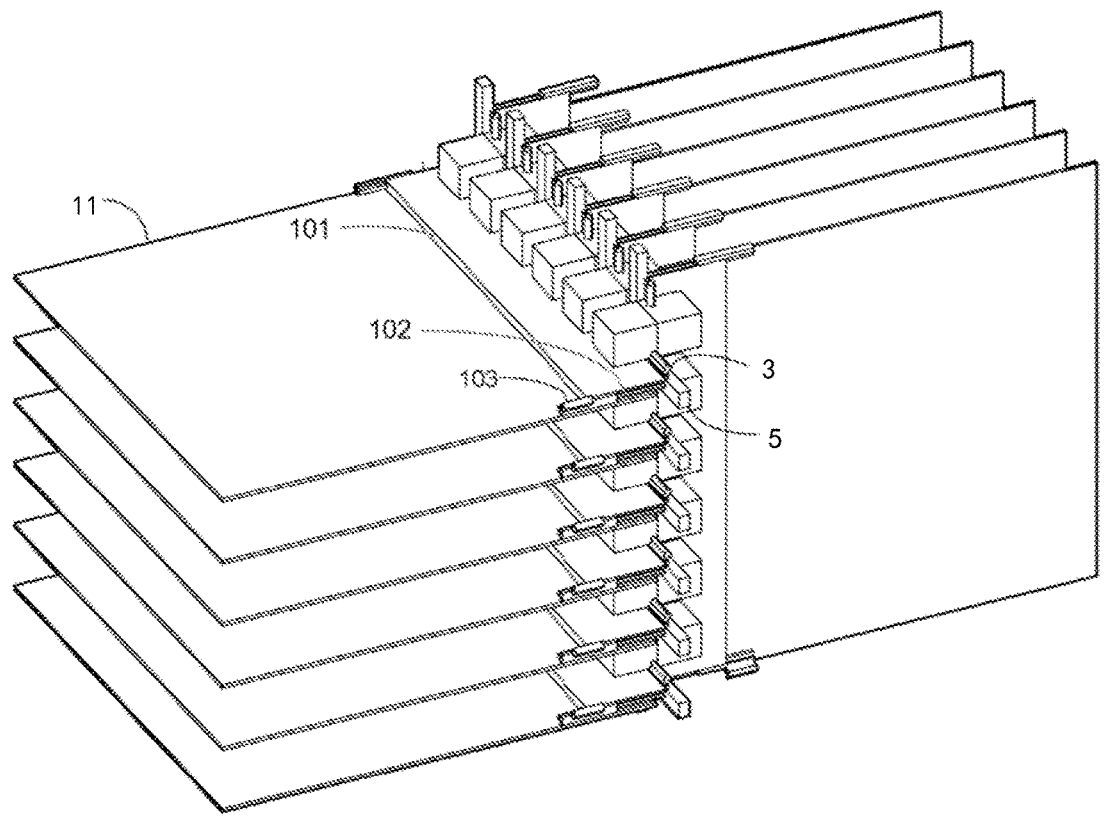
FIG. 4 is a schematic diagram of a retaining frame of the single-board assembly connection structure according to the embodiment of the disclosure.

In some embodiments, referring to FIG. 4, the single-board assembly connection structure further includes a retaining frame 5, the first single-board assembly group and the second single-board assembly group being arranged on opposite sides of the retaining frame 5.

The single-board assembly connection structure according to the embodiment of the disclosure further includes: a retaining frame 5, which can be specifically a system frame, on opposite sides of which the first single-board assembly group and the second single-board assembly group are located, respectively. The retaining frame 5 has a slot for insertion of the single board 11 or the single board 21. When the single board 11 or single board 21 is fully inserted into the slot, it is assumed that the cable connector 104 or cable connector 204 corresponding to the single board 11 or single board 21 is seated in place. When the single board 21 or single board 11 corresponding to the cable connector 204 or 104 connected to the above cable connector 104 or 204 is also fully inserted into the retaining frame 5, the two cable connectors 104 and 204 are properly connected and are in the full-mate state.

In some embodiments, the single-board assembly 1 or 2 of the single-board assembly connection structure according to this embodiment of the disclosure both include a sliding lock, an assembly process of which can specifically be as follows.

As the sliding lock 103 or 203 is locked, the bearing member 101 or 201 of the cable connection structure and the single board 11 or 21 of the single-board assembly 1 or 2 become a rigid structural relationship, and have a fixed relative position. The single board 11 or 21 of the single-board assembly 1 or 2 having the fixed relative position to the bearing member 101 or 102 is inserted into the retaining frame 5, such that the second port of the cable connector 104 or 204 thereon can be connected to the second port of the cable connector 204 or 104 of the single-board assembly 2 or 1 in the corresponding group.

When both the single board assemblies 1 and 2 of the first single-board assembly group and the second single-board assembly group are completely inserted into the fixed frame 5, i.e., the cable connector 104 of the first single-board assembly group is fully mated with the cable connector 204 of the second single-board assembly group, the connection lock 3 is locked to fix the connection status of the cable connector 104 of the first single-board assembly group and the cable connector 204 of the second single-board assembly group. In the meanwhile, the sliding locks 103 and 203 are also unlocked to allow the single boards 11 and 12 to slide along the sliding structures 102 and 202.

When the system of the single-board assembly connection structure does not work properly since there is a deformation or tolerance of the single board 11 or 21 so that the single board 11 or 21 does not reach its predetermined position (e.g., the other side of the single board 11 or 21 cannot be fully connected to other components of the system) in the case that the cable connector 104 of the first single-board assembly group and the cable connector 204 of the second single-board assembly group are working in the full-mate state, the single board 11 or 21 is slid to reach its predetermined position (i.e., the position of the cable connector 104 or 204 does not move and the single board 11 or 21 can be slidable without being fully inserted into the fixed frame 5) to ensure that the system of the single-board assembly connection structure can work properly. At the same time, the cable connector 104 of the first single-board assembly group and the cable connector 204 of the second single-board assembly group can also work in the full-mate state.

In some embodiments, the cable connection structure of the single-board assembly connection structure further includes a sliding lock 103 or 203.

Figure 6:
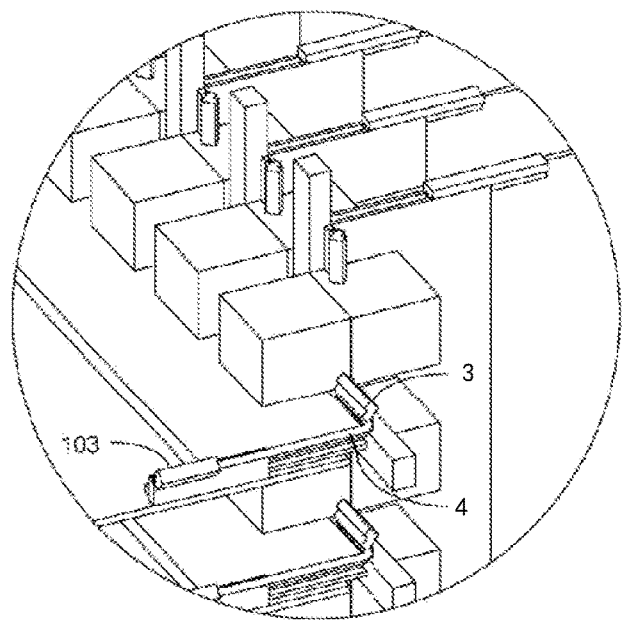
FIG. 6 is a schematic diagram of a linkage structure in the single-board assembly connection structure according to the embodiment of the disclosure.

Referring to FIG. 6, the single-board assembly connection structure further includes a linkage structure 4 that is configured to place the connection lock 3 in a locked state and place the sliding lock in an unlocked state; or to place the connection lock 3 in an unlocked state and place the sliding lock in a locked state.

The single-board assembly connection structure according to the embodiment of the disclosure further includes a sliding lock 103 or 203, a connection lock 3, and a linkage structure 4.

When the sliding lock 103 or 203 of the single-board assembly 1 or 2 is in the locked state, the single board 11 or 21 of the single-board assembly 1 or 2 reaches a rigid structural relationship with the bearing member 101 or 201 and has a fixed relative position. When the sliding lock 103 or 203 of the single-board assembly 1 or 2 is in the unlocked state, the single board 11 or 12 of the single-board assembly 1 or 2 is slidable in the first direction relative to the bearing member 101 or 201.

When the connection lock 3 is in the locked state, the second port of the cable connector 104 of the first single-board assembly group is connected to the second port of the cable connector 204 of the second single-board assembly group, i.e., the cable connector 104 of the first single-board assembly group is fully mated with the cable connector 204 of the second single-board assembly group. When the connection lock 3 is unlocked, the position of the second port of the cable connector 104 of the first single-board assembly group and the position of the second port of the cable connector 204 of the second single-board assembly group can be changed relative to each other.

The linkage structure 4 links the sliding lock 103 or 203 and the connection lock 3 to ensure that when the connection lock 3 is in the locked state, the sliding lock is in the unlocked state; or when the connection lock 3 is in the unlocked state, the sliding lock is in the locked state.

The linkage structure 4 enables the linkage of the connection lock 3 and the sliding lock 103 or 203, thereby avoiding the connection lock 3 and the sliding lock 103 or 203 being in the same state to result in an inproper work of the single-board assembly connection structure according to the embodiment of the disclosure. If both the connection lock 3 and the sliding lock 103 or 203 are in the unlocked state, the bearing member 101 or 201 can also slide as the single board 11 or 21 slides, causing that the cable connector 104 of the first single-board assembly group and the cable connector 204 of the second single-board assembly group can not fully mated with each other.

Figure 5:
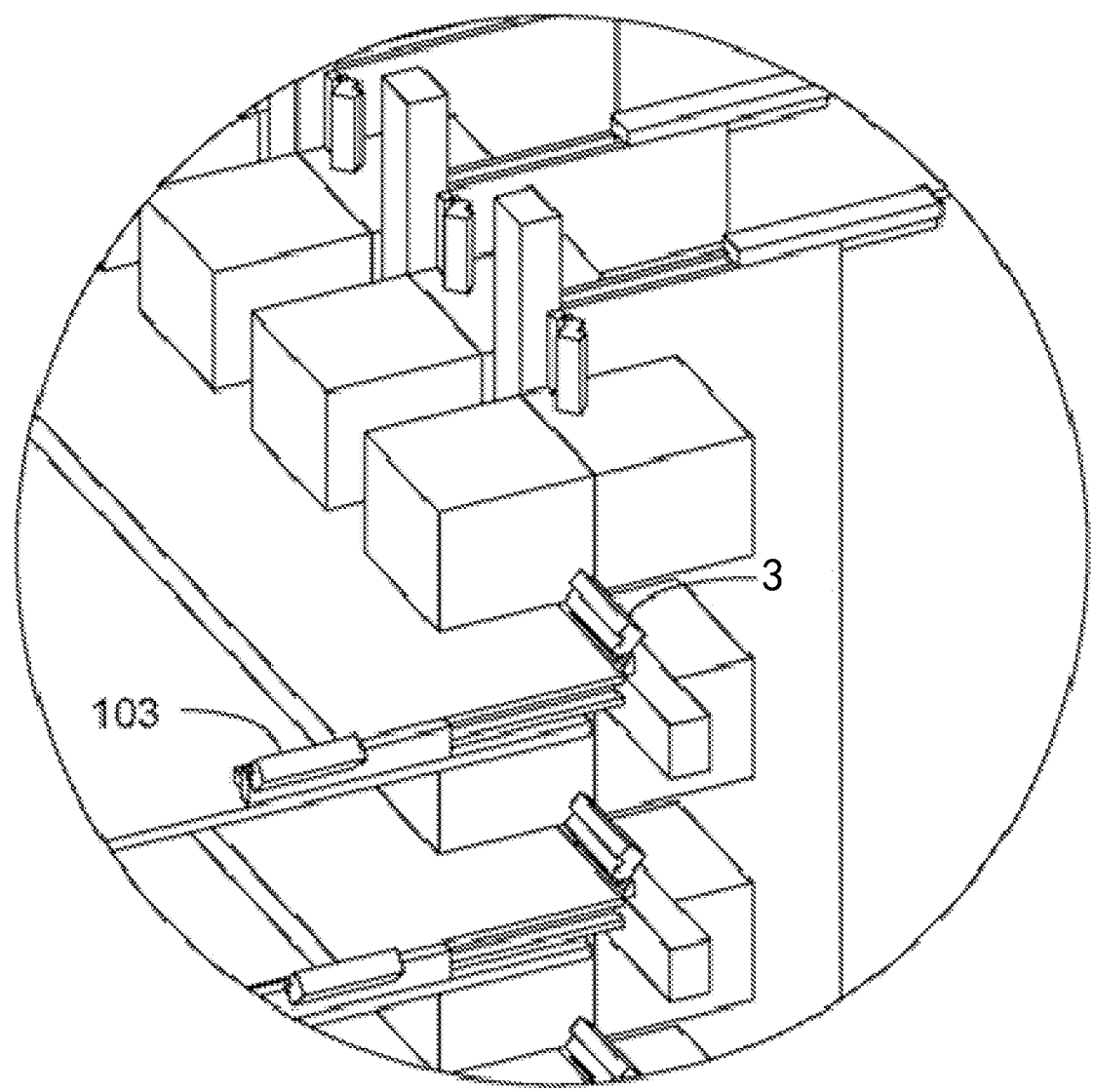
FIG. 5 is a schematic diagram of a sliding lock and a connection lock in the single-board assembly connection structure according to the embodiment of the disclosure.

Of course, reference can be made to FIG. 5, where the single-board assembly connection structure does not include the linkage structure 4. Then it is possible to place the connection lock 3 in a locked state and place the sliding lock in an unlocked state; or place the connection lock 3 in an unlocked state and place the sliding lock in a locked state, by manual control.

Figure 7:
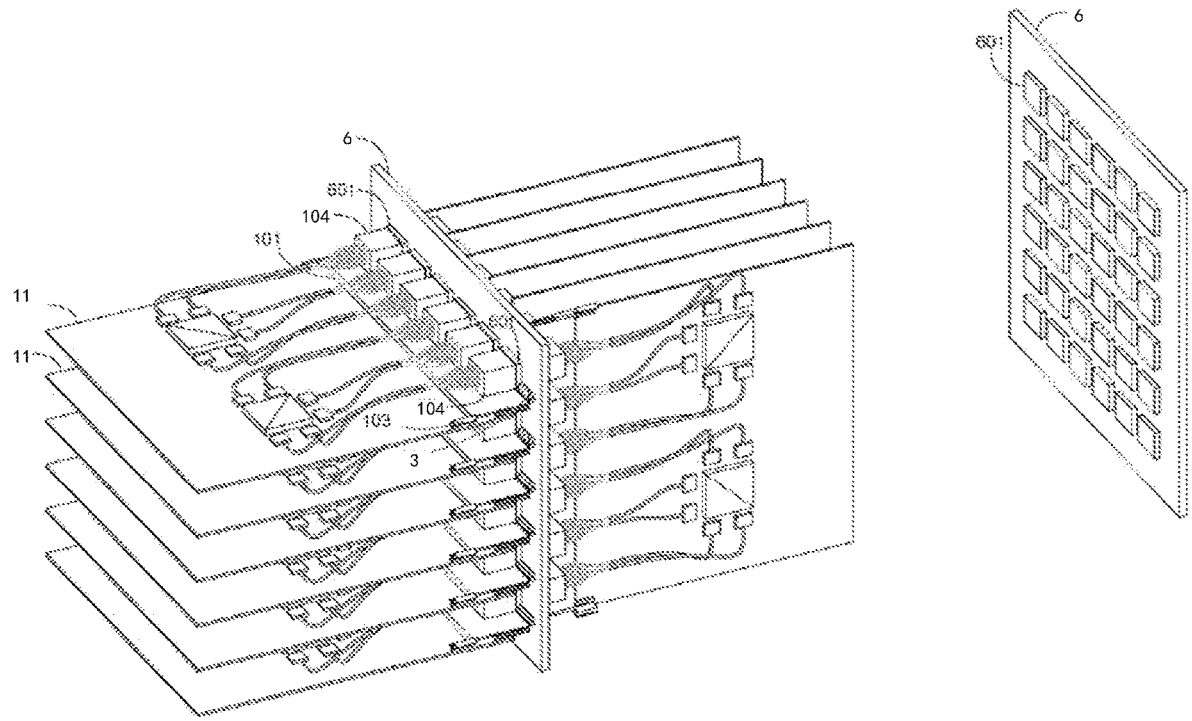
FIG. 7 is a schematic diagram of another single-board assembly connection structure according to an embodiment of the disclosure.
Figure 8:
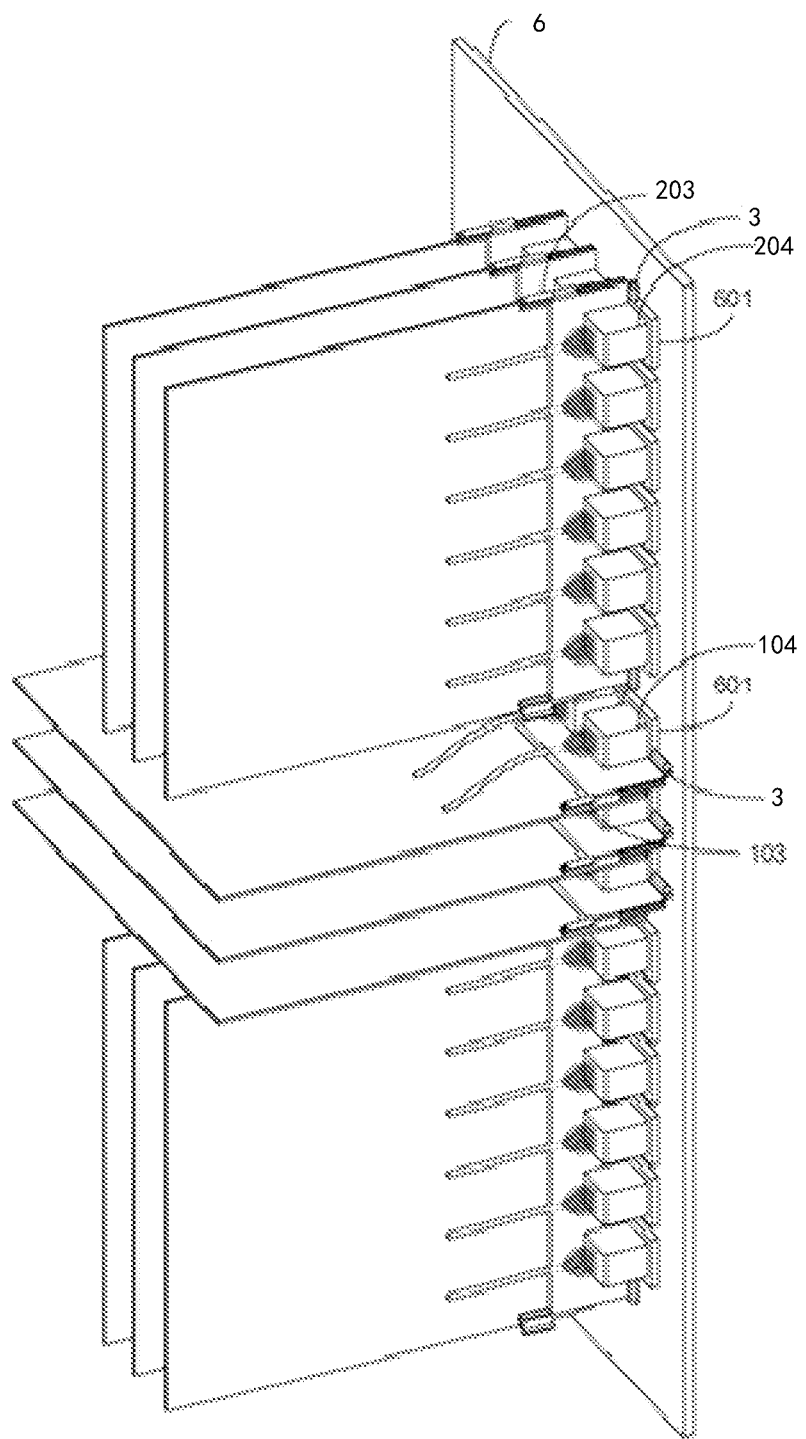
FIG. 8 is a schematic diagram of another single-board assembly connection structure according to an embodiment of the disclosure.

In some embodiments, referring to FIGS. 7 and 8, the board assembly connection structure further includes a back plate 6.

The bearing member 101 or 201 is coupled to the back plate 6.

The back plate 6 has a third port, the third port is connected to a second port, and the third port which is connected to the second port of the single-board assembly 1 in the first single-board assembly group is connected via a connection circuit to another third port which is connected to the second port of the single-board assembly 2 in the second single-board assembly group.

Referring to FIG. 7, the bearing member 101 or 201 is connected to the back plate 6, and the second port of the cable connector 104 of each single-board assembly 1 in the first single-board assembly group can also be connected to a port of the back plate connector on the back plate 6, i.e., the second port of the cable connector 104 is fully mated with the back plate connector. The second port of the cable connector 204 of each single-board assembly 2 in the second single-board assembly group is also connected to another port of the back plate connector, also in the full-mate state.

The back plate 6 has a plurality of back plate connectors 601. The cable connectors 104 in the first single-board assembly group that connect different ports of the same back plate connector are electrically connected to the cable connectors 204 in the second single-board assembly group via the back plate connectors 601. Since the cable connectors 104 or 204 of each single-board assembly 1 or 2 are in the full-mate state with the back plate connectors 601, the cable connectors 104 in the first single-board assembly group are naturally and fully mated with the cable connectors 204 in the second single-board assembly group.

Of course, referring to FIG. 8, the first single-board assembly group and the second single-board assembly group can be arranged on the same side of the back plate 6. At this point, the different back plate connectors on the back plate 6 are electrically connected. The cable connector 104 in the first single-board assembly group and the cable connector 204 in the second single-board assembly group that connects the two electrically connected back plate connectors are also connected through the two back plate connectors.

In the actual structure, the second single-board assembly group can also be replaced with a conventional PCB crimp connector. In other words, the second port of the cable connector 104 of the single-board assembly 1 in the first single-board assembly group is connected to the PCB crimp connector through the back plate connector for implementing the signal transmission.

The example embodiments have been disclosed herein. While specific terms are employed, they are used and should be construed only in a general illustrative sense and are not intended for the limiting purpose. In some examples, it will be apparent to those skilled in the art that features, characteristics and/or elements described in combination with particular embodiments can be used alone, or can be used in combination with features, characteristics and/or elements described in combination with other embodiments, unless otherwise expressly noted. Thus, it will be understood by those skilled in the art that various changes in form and detail can be made without departing from the scope of the disclosure as set forth by the appended claims.

What is claimed is:

1. A cable connection structure, comprising:
a bearing member, the bearing member being provided with at least one cable connector, and each of the at least one cable connector has a first port connected to a cable and a second port electrically connected to the first port; and
a sliding structure connected to the bearing member, the bearing member connected to a single board through the sliding structure, the bearing member enabling the single board connected to the bearing member to slide in a first direction towards or away from the second port;
wherein the cable connection structure further comprises a sliding lock, the sliding lock fixes the sliding structure relative to the bearing member.

2. The cable connection structure according to claim 1, wherein the bearing member is formed as a plate shape, the at least one cable connector includes a plurality of cable connectors, and the plurality of cable connectors are arranged sequentially in a second direction perpendicular to the first direction.

3. A single-board assembly, comprising a single board and a cable connection structure, wherein
the cable connection structure includes a bearing member, the bearing member being provided with at least one cable connector, and each of the at least one cable connector has a first port connected to a cable and a second port electrically connected to the first port; and
a sliding structure connected to the bearing member, the bearing member connected to the single board through the sliding structure, the bearing member enabling the single board connected to the bearing member to slide in a first direction towards or away from the second port, and wherein
the single board is slidably connected to the bearing member through the sliding structure; the single board includes at least one cable interface; and the cable is connected between the at least one cable interface and the first port of the at least one cable connector;
wherein the cable connection structure further comprises a sliding lock, the sliding lock fixes the sliding structure relative to the bearing member.

4. The single-board assembly according to claim 3, wherein the bearing member is formed as a plate shape, the at least one cable connector includes a plurality of cable connectors, and the plurality of cable connectors are arranged sequentially in a second direction perpendicular to the first direction.

5. A single-board assembly connection structure, comprising:
a first single-board assembly group, the first single-board assembly group including at least one single-board assembly; and
a second single-board assembly group, the second single-board assembly group including at least one single-board assembly, wherein
each of the at least one single-board assembly in the first single-board assembly group and the at least one single-board assembly in the second single-board assembly group includes a single board and a cable connection structure, the cable connection structure including a bearing member, the bearing member being provided with at least one cable connector, and each of the at least one cable connector has a first port connected to a cable and a second port electrically connected to the first port; and a sliding structure connected to the bearing member, the bearing member connected to the single board through the sliding structure, the bearing member enabling the single board connected to the bearing member to slide in a first direction towards or away from the second port, wherein the single board is slidably connected to the bearing member through the sliding structure, the single board includes at least one cable interface, and the cable is connected between the at least one cable interface and the first port of the at least one cable connector, and wherein
the second port of the at least one cable connector of each of the at least one single-board assembly in the first single-board assembly group is electrically connected to the second port of the at least one cable connector of each of the at least one single-board assembly in the second single-board assembly group;
wherein the cable connection structure further comprises a sliding lock, the sliding lock fixes the sliding structure relative to the bearing member.

6. The single-board assembly connection structure according to claim 5, wherein the second port of the at least one cable connector of each of the at least one single-board assembly in the first single-board assembly group is connected to the second port of the at least one cable connector of the at least one single-board assembly in the second single-board assembly group.

7. The single-board assembly connection structure according to claim 5, further comprising a retaining frame, the first single-board assembly group and the second single-board assembly group being arranged on opposite sides of the retaining frame.

8. The single-board assembly connection structure according to claim 5, further comprising a connection lock, the connection lock being configured to lock the at least one cable connector of the first single-board assembly group relative to the at least one cable connector of the second single-board assembly group electrically connected to the at least one cable connector of the first single-board assembly group.

9. The single-board assembly connection structure according to claim 8, wherein
the cable connection structure of the single-board assembly connection structure further comprises the sliding lock; and
the single-board assembly connection structure further comprises a linkage structure, the linkage structure being configured to place the connection lock in a locked state and place the sliding lock in an unlocked state; or to place the connection lock in the unlocked state and place the sliding lock in the locked state.

10. The single-board assembly connection structure according to claim 5, wherein
the at least one single-board assembly of the first single-board assembly group including a plurality of single-board assemblies, wherein the single boards of the at least one single-board assemblies in the first single-board assembly group are parallel to each other; and
the at least one single-board assembly of the second single-board assembly group including a plurality of single-board assemblies, wherein the single boards of the at least one single-board assemblies in the second single-board assembly group are parallel to each other and have an included angle greater than 0 degrees and less than or equal to 90 degrees relative to the single boards in the first single-board assembly group.

11. The single-board assembly connection structure according to claim 5, further comprising a back plate, wherein
the bearing member is coupled to the back plate; and
the back plate has a third port, the third port connected to the second port in the first single-board assembly group being connected through a connecting circuit to another third port which is connected to the second port in the second single-board assembly group.

12. The single-board assembly connection structure according to claim 5, wherein the bearing member is formed as a plate shape, the at least one cable connector includes a plurality of cable connectors, and the plurality of cable connectors are arranged sequentially in a second direction perpendicular to the first direction.

* * * * *